(12) United States Patent
Taniguchi (10) Patent No.: US 8,503,188 B2
(45) Date of Patent: Aug. 6, 2013

(54) MOUNTABLE ELECTRONIC CIRCUIT MODULE

(75) Inventor: Katsumi Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 162 days.

(21) Appl. No.: 13/094,925

(22) Filed: Apr. 27, 2011

(65) Prior Publication Data

US 2011/0199745 A1 Aug. 18, 2011

Related U.S. Application Data

(63) Continuation of application No. PCT/JP2009/068570, filed on Oct. 29, 2009.

(30) Foreign Application Priority Data

Nov. 4, 2008 (JP) .................................. 2008-283377

(51) Int. Cl.
*H05K 7/00* (2006.01)
(52) U.S. Cl.
USPC ............ 361/782; 361/783; 361/760; 174/260
(58) Field of Classification Search
USPC ................. 361/782, 760, 761, 743, 783, 738, 361/763; 174/260
See application file for complete search history.

(56) References Cited

U.S. PATENT DOCUMENTS

| 6,373,714 B1* | 4/2002 | Kudoh et al. ................. 361/760 |
| 6,985,364 B2 | 1/2006 | Higashitani et al. |
| 2004/0070950 A1* | 4/2004 | Higashitani et al. .......... 361/728 |
| 2009/0068445 A1 | 3/2009 | Nishizawa |

FOREIGN PATENT DOCUMENTS

| JP | 61-199051 U | 12/1986 |
| JP | 05-211280 A | 8/1993 |
| JP | 08-88474 A | 4/1996 |
| JP | 2000-114686 A | 4/2000 |
| JP | 2002-299775 A | 10/2002 |
| JP | 2003-115664 A | 4/2003 |
| JP | 2006-100451 A | 4/2006 |
| WO | 2007/148556 A1 | 12/2007 |

OTHER PUBLICATIONS

Official Communication issued in International Patent Application No. PCT/JP2009/068570, mailed on Dec. 22, 2009.

\* cited by examiner

*Primary Examiner* — Timothy Thompson
*Assistant Examiner* — Andargie M Aychillhum
(74) *Attorney, Agent, or Firm* — Keating & Bennett, LLP (57) ABSTRACT

A mountable electronic circuit module which produces appropriate characteristics without a complicated structure can be a DC-DC converter including a baseboard made of a magnetic material. A helical electrode is provided in the baseboard so as to function as a smoothing inductor device. Capacitor devices in addition to a DC-DC converter IC are mounted on a main surface of the baseboard. A circuit electrode arranged to connect the circuit devices is provided to enable the circuit devices to function as the DC-DC converter. The DC-DC converter is mounted on a motherboard through external connection electrodes of the capacitor devices.

9 Claims, 6 Drawing Sheets

MOUNTABLE ELECTRONIC CIRCUIT MODULE

BACKGROUND OF THE INVENTION

1. Field of the Invention

The present invention relates to a mountable electronic circuit module having predetermined electrical characteristics and which is mounted on a separate circuit board so as to be electrically connected to the separate circuit board.

2. Description of the Related Art

Presently, various types of electronic circuit modules including various electronic components mounted on a circuit electrode on a laminated board have been disclosed. For example, in an electronic circuit module disclosed in Japanese Unexamined Patent Application Publication No. 2002-299775, a plurality of electronic components are mounted on a top surface of a laminated board, and a cavity is provided in a bottom surface defining a mounting surface of the laminated board. The electronic components are mounted inside the cavity to enable electrical connection to the mounted electronic components.

However, such an electronic circuit module is typically intended to be mounted on a separate circuit board and is provided with a module mounting electrode for mounting the module. It is necessary for a conventional electronic circuit module to include a wire arranged to connect electronic circuit components mounted on a surface thereof and electronic circuit components mounted therein, to the module mounting electrode using a predetermined electric circuit patterns. Such a configuration complicates a wiring electrode pattern, resulting in problems such as an increase in the number of manufacturing processes and an increase in cost. In addition, the wiring electrode pattern may make it difficult to obtain appropriate characteristics of an electronic circuit module.

SUMMARY OF THE INVENTION

To overcome the problems described above, preferred embodiments of the present invention provide a mountable electronic circuit module which produces appropriate characteristics without a complicated structure.

A preferred embodiment of the present invention provides a mountable electronic circuit module that preferably includes a baseboard on which a first mountable electronic component including an external connection electrode is mounted through the external connection electrode. In this mountable electronic circuit module, an electrode provided on an external surface of the first mountable electronic component is a module connection electrode arranged to mount the module to a separate circuit board.

The mountable electronic circuit module is preferably mounted on the separate circuit board through an electrode provided on an external surface of the first mountable electronic component. Thus, it is not necessary to provide an independent mounting electrode to mount the module or a connection electrode pattern for the mounting electrode.

In addition, the module connection electrode of the mountable electronic circuit module according to a preferred embodiment of the present invention is preferably an external connection electrode.

In this configuration, the first mountable electronic component preferably functions as an electronic component connected to the input terminal or the output terminal of the module. This makes it possible to use the external connection electrode of the first mountable electronic component as a module connection electrode. Thus, it is not necessary to provide an independent module connection electrode on the first mountable electronic component, such that the configuration thereof is simplified.

The mountable electronic circuit module according to a preferred embodiment of the present invention preferably includes a second mountable electronic component having a height that is less than the height of the first mountable electronic component. The second mountable electronic component is preferably provided on a mounting surface of the baseboard on which the first mountable electronic component is mounted.

In this configuration, the height of the second mountable electronic component is less than that of the first mountable electronic component. Therefore, even when the second mountable electronic component is mounted on the mounting surface of the first mountable electronic component, the second mountable electronic component can be mounted so as to be accommodated in a space provided by the first mountable electronic component between the baseboard and the separate circuit board.

A plurality of the first mountable electronic components of the mountable electronic circuit module according to a preferred embodiment of the present invention may preferably be provided. Then, the second mountable electronic component is preferably mounted between the mountable electronic components arranged along one direction on the mounting surface of the baseboard.

In this configuration, the second mountable electronic component is mounted within the space between the mountable electronic components. This provides a stable mounting state of the second mountable electronic component.

In the mountable electronic circuit module according to a preferred embodiment of the present invention, a resin film is preferably provided on the mounting surface of the baseboard. This resin film preferably has a shape which enables the second mountable electronic component to be covered and portions of the first mountable electronic component which are to be mounted on the separate circuit board to be exposed.

In this configuration, the mounting state of the first mountable electronic component and the second mountable electronic component on the mounting surface of the baseboard is protected by the resin film, which provides a more stable mounting state.

The first mountable electronic component of the mountable electronic circuit module according to a preferred embodiment of the present invention preferably includes a casing having a rectangular parallelepiped shape. The module connection electrode preferably includes a first connection electrode and a second connection electrode respectively provided on a pair of surfaces of the rectangular parallelepiped casing which face each other in the mounting direction. Preferably, the first connection electrode is an electrode to be mounted on the baseboard and the second connection electrode is an electrode to be mounted on the separate circuit board.

In this configuration, the baseboard and the separate circuit board are preferably connected by the first connection electrode and the second connection electrode respectively provided on the surfaces opposing in the mounting direction of the rectangular parallelepiped first mountable electronic component. This makes it possible to connect the baseboard to the separate circuit board without providing a complicated wiring pattern in the baseboard.

The first mountable electronic component of the mountable electronic circuit module according to a preferred embodiment of the present invention preferably includes a third connection electrode arranged to connect the first connection electrode to the second connection electrode in a direction perpendicular or substantially perpendicular to the pair of surfaces.

The third connection electrode of the mountable electronic circuit module is preferably provided on an end surface of the rectangular parallelepiped casing which is perpendicular or substantially perpendicular to the pair of surfaces.

In this configuration, the first connection electrode and the second connection electrode are preferably connected through the third connection electrode provided on the first mountable electronic component. Since the third connection electrode is provided on an end surface of the first mountable electronic component, electrodes are provided on the opposing surfaces and the end surface. As long as these electrodes are electrically connected to each other, the structure of a conventional mountable component, such as a mountable capacitor device, for example, can be applied, which simplifies the structure.

The first mountable electronic component of the mountable electronic circuit module according to a preferred embodiment of the present invention is preferably a capacitor device. The baseboard defines an inductor device including a magnetic material and an electrode helically wound around at least a portion of the magnetic material.

In this configuration, a mountable electronic circuit module including the inductor element defined by the baseboard and including a capacitor can be easily produced.

The second mountable electronic component according to a preferred embodiment of the present invention is preferably a DC-DC converter IC.

In this configuration, a DC-DC converter is provided as an example of a mountable electronic circuit module. For example, when two first mountable electronic components, which are capacitor devices, are provided, the DC-DC converter having a simple shape can be produced. By using this configuration, an output signal from the DC-DC converter can be output to an external unit without being transmitted through the interior of the baseboard. In addition, the DC-DC converter IC can be connected to the ground without being connected through a circuit in the interior of the baseboard. This prevents an increase in spike noise in an output signal from the DC-DC converter and prevents ripples therein.

In the mountable electronic circuit module according to a preferred embodiment of the present invention, an electrode for a circuit arranged to supply a control signal from an external unit to the DC-DC converter IC is preferably provided on the mounting surface of the baseboard and an external surface of the first mountable electronic component.

In this configuration, an example of a detailed configuration of the DC-DC converter is provided.

According to various preferred embodiments of the present invention, since it is not necessary to provide an independent mounting electrode, e.g., a module connection electrode, in the baseboard which is dedicated to mounting the module, complicated patterns are not required. This decreases the number of manufacturing processes, and provides a structure which does not significantly affect characteristics due to wiring patterns. Thus, a mountable electronic circuit module having a simple structure and producing appropriate characteristics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A mountable electronic circuit module according to a first preferred embodiment of the present invention will be described with reference to the drawings. In the first preferred embodiment, a DC-DC converter module will be described as an example.

Figure 1A:
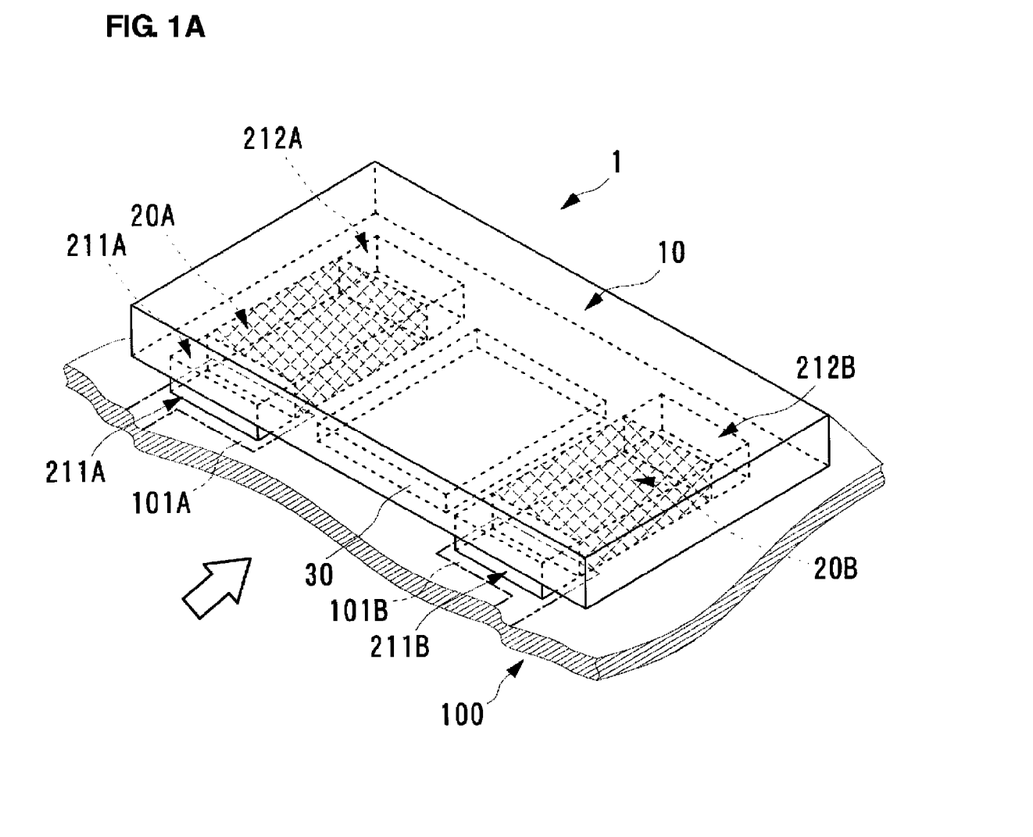
FIGS. 1A and 1B show a perspective external view schematically illustrating a state in which a DC-DC converter of a preferred embodiment of the present invention is mounted on a motherboard and a side view illustrating a mounting state of the DC-DC converter.
Figure 1B:
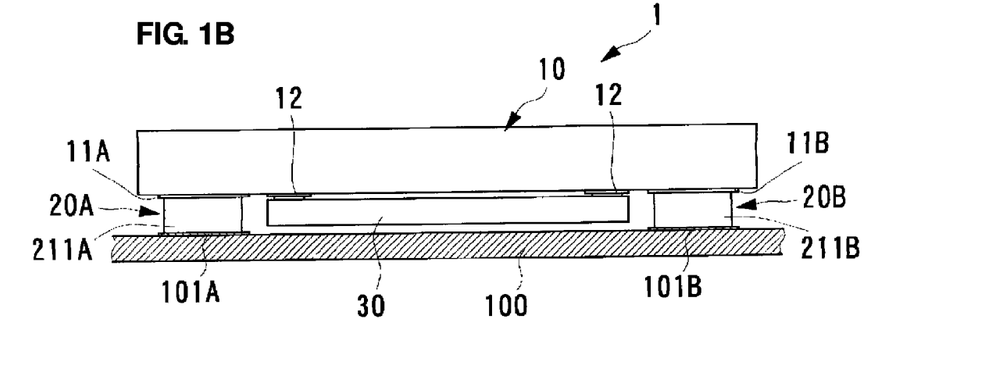

FIG. 1A is a perspective external view schematically illustrating a state in which the DC-DC converter 1 of the first preferred embodiment is mounted on a motherboard 100. FIG. 1B is a side view seen from the arrow in FIG. 1A.

Figure 2:
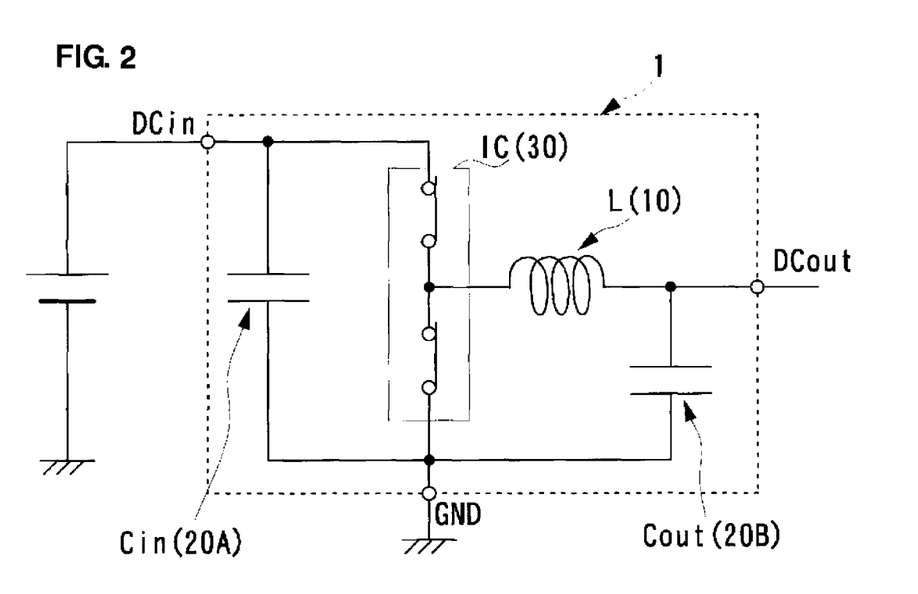
FIG. 2 is an equivalent circuit diagram of the DC-DC converter shown in FIGS. 1A and 1B.

FIG. 2 is an equivalent circuit diagram of the DC-DC converter 1 illustrated in FIG. 1.

As illustrated in FIGS. 1A and 1B, the DC-DC converter 1 preferably includes a baseboard 10 made of ferrite, for example, capacitor devices 20A and 20B, and a DC-DC converter IC 30. These components define the DC-DC converter 1 as illustrated in FIG. 2. An input terminal DCin of the DC-DC converter 1 is connected to a signal input terminal of the DC-DC converter IC 30. An input capacitor Cin is connected between the input terminal DCin and a ground terminal GND. A ground terminal for the DC-DC converter IC 30 is connected to the ground terminal GND of the DC-DC converter 1, and a signal output terminal of the DC-DC converter 1 is connected to one end of a smoothing inductor L. The other end of the smoothing inductor L is connected to an output terminal DCout of the DC-DC converter 1. An output capacitor Cout is connected between the output terminal DCout and the ground terminal GND.

To provide the circuit configuration shown in FIG. 2, preferably, the capacitor device 20A functions as the input capacitor Cin, and the capacitor device 20B functions as the output capacitor Cout. The capacitor device 20A preferably includes a rectangular parallelepiped casing. External connection electrodes 211A and 212A are provided on the opposite ends of the casing in the longitudinal direction. The external connection electrodes 211A and 212A extend from the opposite end surfaces and include four surfaces extending perpendicular or substantially perpendicular to the longitudinal direction. The capacitor device 20B also preferably includes a rectangular parallelepiped casing. External connection electrodes 211B and 212B are provided on the opposite ends of the casing in the longitudinal direction. The external connection electrodes 211B and 212B extend from the opposite end surfaces and include four surfaces extending perpendicular or substantially perpendicular to the longitudinal direction. For the capacitor devices 20A and 20B, either one of the transverse dimensions in directions perpendicular or substantially perpendicular to the longitudinal direction of the casing may be the same. The capacitor devices 20A and 20B may also have the same or substantially the same outer dimensions.

The smoothing inductor L preferably includes the baseboard 10 made of ferrite and a helical wiring pattern which is wound to provide at least a predetermined volume in the interior of the baseboard 10 using an electrode pattern and a through-hole electrode provided on an inner surface of the baseboard 10.

Mounting lands 11A arranged to mount the capacitor device 20A, mounting lands 11B arranged to mount the capacitor device 20B, and a mounting land 12 arranged to mount the DC-DC converter IC 30 are preferably provided on the main surface of the baseboard 10, i.e., the surface facing the motherboard 100 in FIGS. 1A and 1B. The capacitor device 20A is mounted so that the external connection electrodes 211A and 212A are connected to the multiple mounting lands 11A. The capacitor device 20B is mounted so that the external connection electrodes 211B and 212B are connected to the multiple mounting lands 11B. The capacitor devices 20A and 20B are mounted preferably using solder or conductive paste, for example. The DC-DC converter IC 30 is preferably a flip chip including a plurality of mounting terminals arranged together on a single main surface. The DC-DC converter IC 30 is preferably an IC having a height less than the length in a transverse direction perpendicular or substantially perpendicular to the longitudinal direction of the capacitor devices 20A and 20B. The DC-DC converter IC 30 is preferably mounted on the mounting land 12 using a technique such as flip-chip mounting, for example.

Further, a connection electrode pattern (not shown) arranged to provide the circuit configuration of the capacitor devices 20A and 20B and the DC-DC converter IC 30 illustrated in FIG. 2 is preferably provided on the mounting surface of the components of the baseboard 10. Note that the wiring pattern connecting the capacitor devices 20A and 20B to the DC-DC converter IC 30 may be provided on a nonmagnetic layer provided in the baseboard 10.

The DC-DC converter 1 is mounted on the motherboard 100 preferably using the external connection electrodes 211A and 212A of the capacitor device 20A and the external connection electrodes 211B and 212B of the capacitor device 20B as module connection terminals. Specifically, the mounting lands 101A and 101B are provided on the motherboard 100. For example, as illustrated in FIGS. 1A and 1B, the DC-DC converter 1 is mounted so that the external connection electrode 211A of the capacitor device 20A is connected to the mounting land 101A, and the external connection electrode 211B of the capacitor device 20B is connected to the mounting land 101B. Thus, the electrode of the external connection electrode 211A facing the baseboard 10 and the electrode of the external connection electrode 211A facing the motherboard 100 are connected by the electrode provided on the longitudinal end surface of the casing of the capacitor device 20A and the electrodes provided on the two surfaces that oppose each other in the transverse direction. In addition, the electrode of the external connection electrode 211B facing the baseboard 10 and the electrode of the external connection electrode 211B facing the motherboard 100 are connected by the electrode provided on the longitudinal end surface of the casing of the capacitor device 20B and the electrodes provided on the two surfaces that oppose each other in the transverse direction.

This configuration enables the external connection electrodes 211A, 212A, 211B and 212B of the capacitor devices 20A and 20B to be mounted on the motherboard 100 as the module connection terminals for the DC-DC converter 1. Therefore, it is not necessary to provide a mounting electrode module dedicated to mounting the DC-DC converter 1. Further, it is not necessary to provide a circuit electrode to connect the individual circuit components defining the DC-DC converter 1 in the dedicated mounting electrode. This enables the DC-DC converter 1 having a simple structure to be mounted on the motherboard 100 without providing complicated circuit patterns and circuit elements.

At this time, as illustrated in FIGS. 1A and 1B and FIG. 2, the DC-DC converter 1 includes a circuit pattern in which the external connection electrodes 211A, 212A, 211B, and 212B provided in the capacitor devices 20A and 20B preferably function as the input terminal DCin, the output terminal DCout, and the ground terminal GND. Thus, the external connection electrodes 211A, 212A, 211B, and 212B can be used as module connection terminals. Therefore, it is not necessary to provide independent module connection electrodes in the capacitor devices 20A and 20B. As a result, the DC-DC converter 1 having a simpler structure is obtained.

In addition, since the external connection electrodes 211A, 212A, 211B, and 212B of the capacitor devices 20A and 20B function as the input terminal DCin, the output terminal DCout, and the ground terminal GND, it is not necessary to provide a circuit electrode to connect these terminals to the external connection electrodes 211A, 212A, 211B, and 212B, as with the conventional techniques. As a result, characteristics of the DC-DC converter 1 are significantly improved.

Specifically, in a conventional structure, capacitor devices and a DC-DC converter IC are mounted on a baseboard including an inductor provided thereon, and connection terminals are provided on a surface opposite to the mounting surface of the capacitor devices and the DC-DC converter IC so as to be mounted on a motherboard. In this case, it is necessary to provide a connection pattern inside the baseboard to connect the individual circuit elements on the mounting surface to the connection terminals. Therefore, the DC-DC converter IC and the capacitors must to be connected to the ground via the connection patterns in the baseboard. This introduces parasitic inductance between the components, such as the DC-DC converter IC and the capacitors and the ground, which results in an unstable ground. In addition, parasitic inductance may similarly be introduced into a transmission path between the output terminal of the DC-DC converter and the motherboard.

In the conventional DC-DC converter, spike noise is generated due to a switching operation of the DC-DC converter IC. As described above, an unstable ground and parasitic inductance in the output path amplify spike noise and increase ripples.

On the other hand, with the configuration according to the first preferred embodiment, the ground is stabilized and no parasitic inductance is generated, because no connection pattern inside the baseboard described above is necessary. As a result, spike noise is prevented and ripples are significantly improved. These effects are particularly significant when the baseboard is made of a magnetic material.

Figure 3:
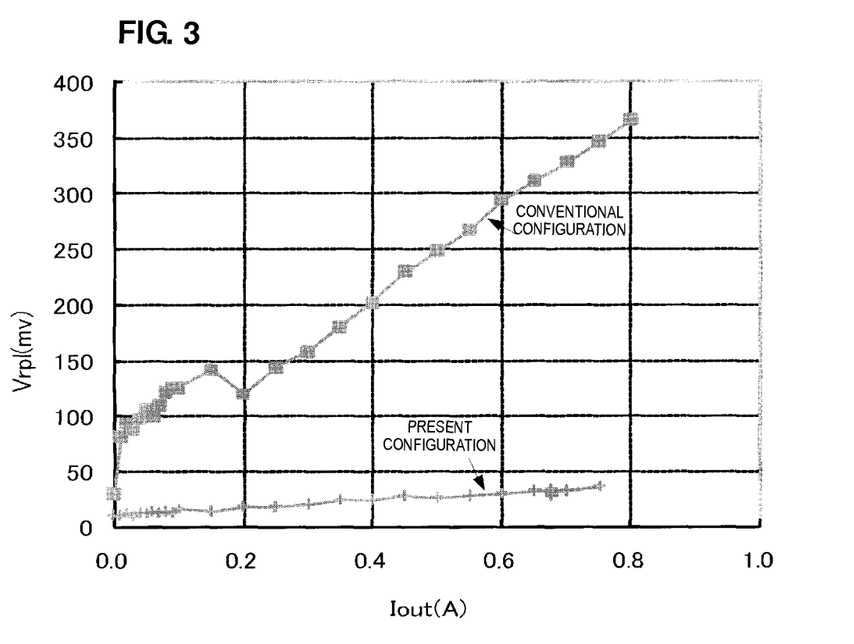
FIG. 3 illustrates a ripple level versus output a current level characteristic of the DC-DC converter shown in FIGS. 1A and 1B.

FIG. 3 illustrates the output current level (Iout) characteristic of the ripple level (Vrpl) in the DC-DC converter 1. As illustrated in FIG. 3, by using the configuration according to the first preferred embodiment, a DC-DC converter having excellent output characteristics, in which ripple is not significantly generated when the output current level (Iout) is increased is achieved.

Further, with the configuration described above, in which circuit components are mounted only on the surface of the baseboard 10 facing the motherboard 100, the surface of the baseboard 10 which is opposed to the surface facing the motherboard 100 can be planarized. Therefore, when mounting the DC-DC converter 1 on the motherboard 100, the module of the DC-DC converter 1 can be easily mounted on the motherboard 100 using a mounter device. This increases the manufacturing efficiency as compared to a conventional structure, in which circuit components are mounted on the surface of the baseboard 10 which is opposed to the surface facing the motherboard 100, and at the same time, mounting defects, such as mounting failure, for example, are prevented.

Further, with the configuration described above, the DC-DC converter IC 30 is sandwiched between the capacitor devices 20A and 20B and disposed in the space between the baseboard 10 and the motherboard 100. Although the DC-DC converter IC 30 is disposed between the baseboard 10 and the motherboard 100, the DC-DC converter IC 30 does not contact the motherboard 100 since the height of the DC-DC converter IC 30 is less than that of the capacitor devices 20A and 20B. This protects the DC-DC converter IC 30 from external factors and forces so as to effectively maintain a stable mounting state.

Figure 4:
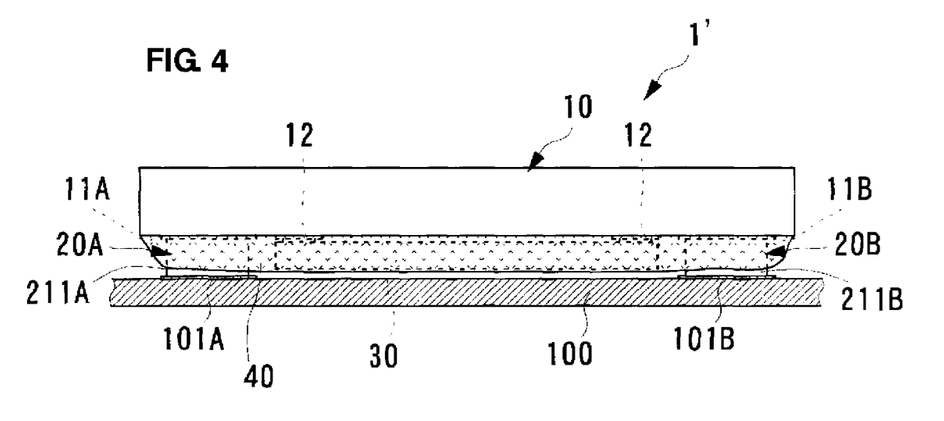
FIG. 4 is a side view illustrating a DC-DC converter including a resin film according to another preferred embodiment of the present invention that is mounted on a motherboard.

In addition, a resin film 40 may preferably be provided on the mounting surface of the baseboard 10. FIG. 4 is a side view illustrating a state in which a DC-DC converter 1' including the resin film 40 is mounted on the motherboard 100. As illustrated in FIG. 4, the thickness of the resin film 40 is preferably set so that the resin film 40 covers the DC-DC converter IC 30 and does not cover at least the surfaces of the external connection electrodes 211A, 212A, 211B, and 212B of the capacitor devices 20A and 20B which face the motherboard 100. This configuration further stabilizes the mounting state of the circuit components mounted on the mounting surface of the baseboard 10 while the DC-DC converter 1 is mounted on the motherboard 100.

Figure 5:
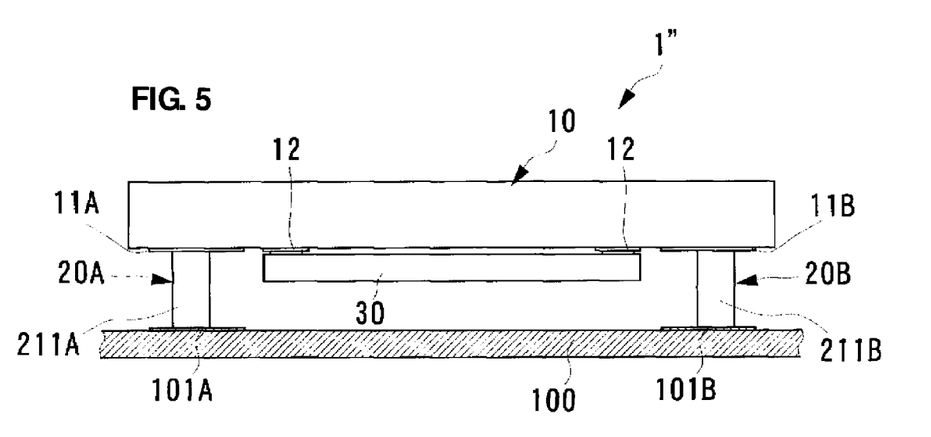
FIG. 5 is a side view illustrating a DC-DC converter according to another preferred embodiment of the present invention that is mounted on a motherboard.

Moreover, the configuration described above is an example in which the capacitor devices 20A and 20B are connected to the baseboard 10 and the motherboard 100 using a pair of surfaces of the external connection electrodes 211A, 212A, 211B, and 212B that are opposed to one another in directions perpendicular or substantially perpendicular to the longitudinal direction of the capacitor devices 20A and 20B that correspond to the shorter side. However, as illustrated in FIG. 5, the capacitor devices 20A and 20B may preferably be connected to the baseboard 10 and the motherboard 100 using a pair of surfaces of the external connection electrodes that are opposed to each other in directions perpendicular or substantially perpendicular that correspond to the longer side. FIG. 5 is a side view illustrating a state in which a DC-DC converter 1" having a modified configuration according to the first preferred embodiment is mounted on the motherboard 100. With this configuration, restrictions on the height of the DC-DC converter IC 30 can be relaxed.

A mountable electronic circuit module according to a second preferred embodiment of the present invention will be described with reference to the drawings. Also in the second preferred embodiment, a DC-DC converter module will be described as an example.

Figure 6A:
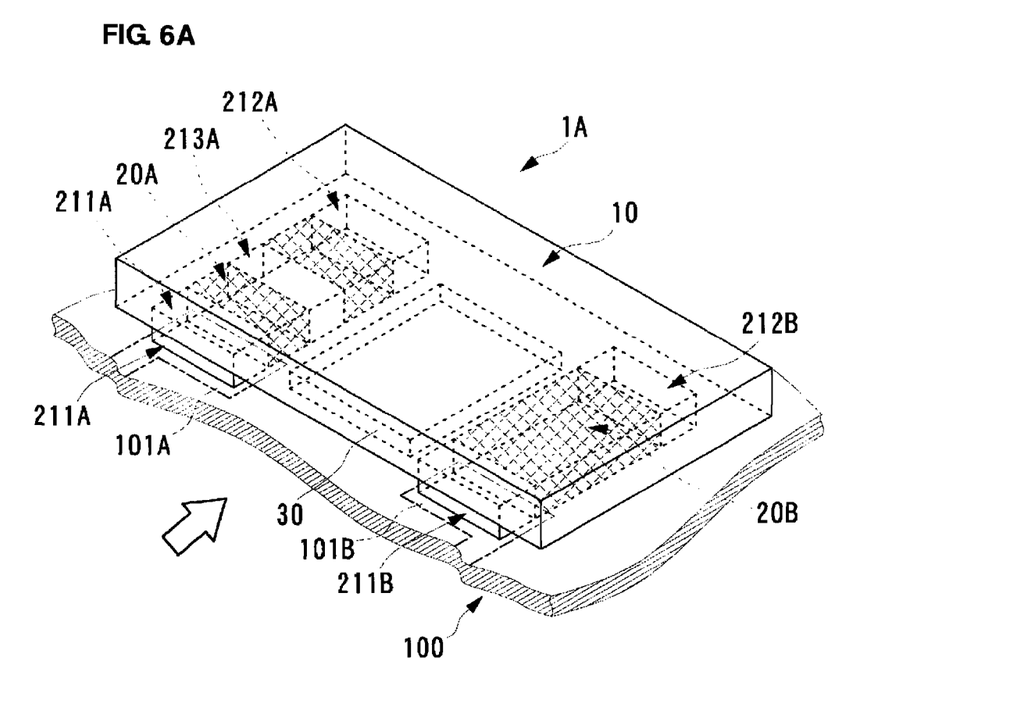
FIGS. 6A and 6B show a perspective external view of a DC-DC converter according to another preferred embodiment that is mounted on a motherboard and an equivalent circuit diagram of the DC-DC converter.
Figure 6B:
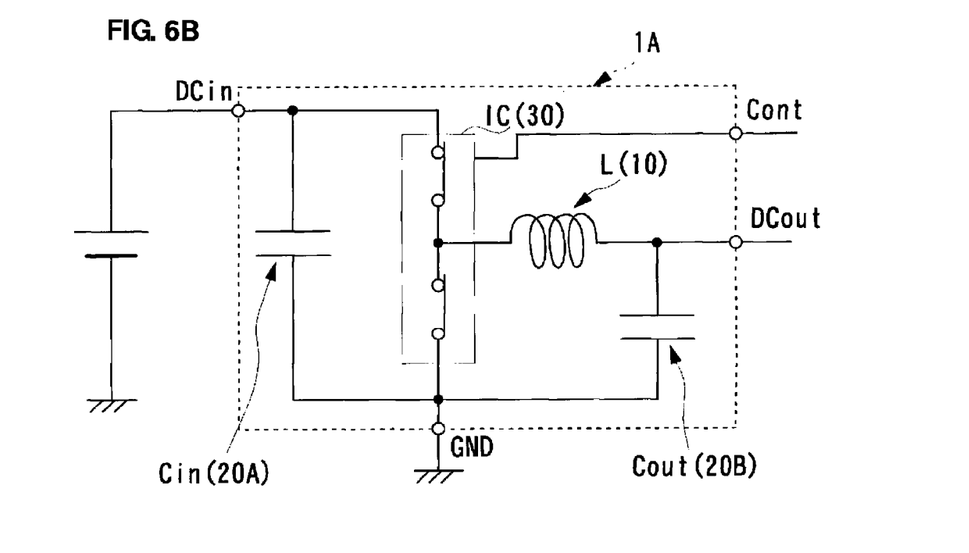

FIG. 6A is a perspective external view schematically illustrating a state in which a DC-DC converter 1A of the second preferred embodiment is mounted on the motherboard 100. FIG. 6B is an equivalent circuit diagram of the DC-DC converter 1A illustrated in FIG. 6A.

The DC-DC converter 1A of the second preferred embodiment preferably includes a control signal input terminal Cont arranged to input a control signal to the DC-DC converter IC 30 that is provided in the DC-DC converter 1 of the first preferred embodiment.

A circuit electrode arranged to supply a control signal from the control signal input terminal Cont to the DC-DC converter IC 30 is preferably provided on the mounting surface of the baseboard 10 as well as on external surfaces of the casing of the capacitor element 20A. The circuit electrode provided on the external surfaces of the casing of the capacitor element 20A is a connection electrode 213A arranged so as not to be connected to an internal circuit and the external connection electrodes 211A and 212A of the capacitor device 20A. The connection electrode 213A is arranged so as to extend around four surfaces along the longitudinal direction of the capacitor device 20A. The connection electrode 213A is connected to the baseboard 10 and the motherboard 100 using a pair of surfaces that are opposed to each other in the mounting direction. Thus, by providing and using an electrode different from the external connection electrodes 211A, 212A, 211B, and 212B of the capacitor devices 20A and 20B, a circuit connecting the terminal that is not to be connected to the capacitor devices 20A and 20B, to an external circuit is provided using the capacitor devices 20A and 20B.

Moreover, the configuration described above makes it possible to remove parasitic inductance in an input path of a control signal to the DC-DC converter IC as well as to prevent ripples at the output terminal of the DC-DC converter. As a result, a stable control signal can be supplied to the DC-DC converter IC and ripple are effectively prevented.

The DC-DC converter including a baseboard 10 made of a magnetic material has been described as an example. The configurations described above can also be applied to an electronic circuit module including a baseboard 10 made of a dielectric laminated substrate and electronic components are mounted on the laminated substrate.

Moreover, the above description illustrates an example in which the baseboard 10 and the motherboard 100 are connected through the two capacitor devices 20A and 20B. However, the structure to electrically connect a module to be mounted to a separate circuit board for mounting the module can also be achieved by using the configurations described above for at least one circuit element.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mountable electronic circuit module comprising:
    a baseboard including a ferrite material;
    a first mountable electronic component including at least one first external connection electrode, the first mountable electronic component being mounted on a surface of the baseboard via the at least one first external connection electrode;
    at least one electrode provided on an external surface of the first mountable electronic component and defining at least one module connection electrode arranged to mount the electronic circuit module to a separate circuit board; and
    a second mountable electronic component having a height less than a height of the first mountable electronic component; wherein
    the second mountable electronic component includes at least one second external connection electrode that is connected to the at least one module connection electrode via an external surface of the baseboard; and the second mountable electronic component is a DC-DC converter IC that is mounted on the surface of the baseboard on which the first mountable electronic component is mounted.

2. The mountable electronic circuit module according to claim 1, wherein
a plurality of the first mountable electronic components are provided; and
the second mountable electronic component is mounted between the plurality of first mountable electronic components arranged along one direction on the mounting surface of the baseboard on which the first mountable electronic components and the second mountable electronic component are mounted.

3. The mountable electronic circuit module according to claim 1, wherein
a resin film is provided on the mounting surface of the baseboard; and
the resin film has a shape which enables the second mountable electronic component to be covered and enables portions of the first mountable electronic components to be mounted on the separate circuit board to be exposed.

4. The mountable electronic circuit module according to claim 1, wherein
the first mountable electronic component includes a casing having a rectangular parallelepiped shape;
the at least one module connection electrode includes a first connection electrode and a second connection electrode respectively provided on a pair of surfaces of the rectangular parallelepiped casing opposing each other in a mounting direction of the rectangular parallelepiped casing; and
the first connection electrode is arranged to be mounted on the baseboard and the second connection electrode is arranged to be mounted on the separate circuit board.

5. The mountable electronic circuit module according to claim 4, wherein the at least one module connection electrode of the first mountable electronic component includes a third connection electrode arranged to connect the first connection electrode to the second connection electrode in a direction perpendicular or substantially perpendicular to the pair of surfaces.

6. The mountable electronic circuit module according to claim 5, wherein the third connection electrode is provided on an end surface of the rectangular parallelepiped casing, the end surface being perpendicular or substantially perpendicular to the pair of surfaces.

7. The mountable electronic circuit module according to claim 1, wherein
the first mountable electronic component is a capacitor device; and
the baseboard includes an inductor device including a magnetic material and an electrode helically wound around at least a portion of the magnetic material.

8. The mountable electronic circuit module according to claim 1, wherein
the first mountable electronic component includes a plurality of the first external connection electrodes including an input or output electrode and a ground electrode; and
the second mountable electronic component includes a plurality of the second external connection electrodes including an input or output electrode and a ground electrode; wherein
the input or output electrode and the ground electrode of the first mountable electronic component define two of the module connection electrodes; and
the ground electrode of the second mountable electronic component is connected to the ground electrode of the first mountable electronic component via an external surface of the baseboard.

9. The mountable electronic circuit module according to claim 8, wherein:
the second mountable electronic component includes a control electrode;
the first mountable electronic component includes a third module connection electrode which is different from the input or output electrode and the ground electrode of the first mountable electronic component; and
the control electrode of the second mountable electronic component is connected to the third module connection electrode via an external surface of the baseboard.

\* \* \* \* \*